US006538448B1

(12) United States Patent
Tabell

(10) Patent No.: US 6,538,448 B1
(45) Date of Patent: Mar. 25, 2003

(54) DETERMINING REMAINING OPERATING LIFE OF FLUORESCENT LAMP

(75) Inventor: Jari Tabell, Lahti (FI)

(73) Assignee: Teknoware Oy, Lahti (FI)

( * ) Notice: Subject to any disclaimer, the term of this patent is extended or adjusted under 35 U.S.C. 154(b) by 0 days.

(21) Appl. No.: 09/670,430

(22) Filed: Sep. 26, 2000

(30) Foreign Application Priority Data

Sep. 27, 1999 (FI) ............................................ 19992063

(51) Int. Cl.[7] ................................................ G01R 31/00

(52) U.S. Cl. .................... 324/414; 324/403; 324/76.11; 340/641; 315/121

(58) Field of Search ................................ 340/641, 635, 340/642, 660; 313/491; 315/291, 119, 247, 121; 324/414, 71.1, 76.11, 76.77, 403

(56) References Cited

U.S. PATENT DOCUMENTS

| | | | | |
|---|---|---|---|---|
| 4,277,728 A | * | 7/1981 | Stevens | 315/307 |
| 5,103,133 A | * | 4/1992 | Misono | 313/491 |
| 5,424,611 A | * | 6/1995 | Moriarty, Jr. | 315/94 |
| 5,606,224 A | * | 2/1997 | Hua | 315/121 |
| 5,925,986 A | * | 7/1999 | Moisin | 315/247 |
| 6,002,214 A | * | 12/1999 | Ribarich | 315/307 |
| 6,177,768 B1 | * | 1/2001 | Kimata et al. | 315/241 R |
| 6,243,017 B1 | * | 5/2001 | Kuisma | 340/641 |

FOREIGN PATENT DOCUMENTS

| | | |
|---|---|---|
| EP | 0731437 | 9/1996 |
| EP | 0 845 928 A1 | 6/1998 |
| EP | 0936846 | 8/1999 |
| EP | 0 936 846 A1 * | 8/1999 |

* cited by examiner

*Primary Examiner*—N. Le
*Assistant Examiner*—T. R. Sundaram
(74) *Attorney, Agent, or Firm*—Leydig, Voit & Mayer, Ltd

(57) ABSTRACT

A method for determining the remaining operating life of a fluorescent lamp comprising cathodes, when the fluorescent lamp is a part of a fluorescent lamp circuit, which in addition to the fluorescent lamp includes a ballast, for example a capacitor and an inductance. In accordance with the method the remaining operating life of the fluorescent lamp is deduced from a phase difference of a voltage applied over a cathode in relation to another current or voltage phase in the fluorescent lamp circuit.

18 Claims, 2 Drawing Sheets

DETERMINING REMAINING OPERATING LIFE OF FLUORESCENT LAMP

BACKGROUND OF THE INVENTION

The invention relates to a method and an arrangement for determining the remaining operating life of a fluorescent lamp comprising cathodes, when the fluorescent lamp is a part of a fluorescent lamp circuit, which in addition to the fluorescent lamp includes a ballast, for example a capacitor and an inductance.

Fluorescent lamp lighting fixtures are generally used on account of a long operating life and good color reproduction properties. The operating life of a fluorescent lamp is mainly determined according to the durability of cathodes, which, in turn, mainly depends on the number of fluorescent lamp ignitions. The fluorescent lamps used chiefly in Europe are hot cathode tubes, in which the cathodes are heated to a high temperature before the lamp is actually switched on.

The cathodes are formed to resemble a resistance wire in order to heat the cathodes in the fluorescent lamps. The cathode surface comprises an active material providing an ionization that is necessary for the operation of the lamp. A filament current is conducted through a cathode resistor that heats the cathodes before the fluorescent lamp is switched on, thus facilitating the beginning of the ionization of the active material in the cathode. The cathodes are preheated by a ballast starter system, in which the current flows through the cathodes and the ballast as well as the starter during preheating. When the cathodes are adequately heated, the starter stops conducting and disconnects the filament circuit. On account of the energy stored in the ballast during the heating of the cathodes, the current starts flowing in the fluorescent lamp and produces UV radiation. The UV radiation produced by a gas breakdown is absorbed into a phosphor layer on the surface of the lamp transforming the energy of the absorbed radiation into visible light.

A choke-capacitor circuit can also be used for igniting or burning fluorescent lamps. In the choke-capacitor circuit a choke and a capacitor form a resonance circuit which is used fairly commonly when fluorescent lamps are used at a high frequency. A stray inductance of a secondary winding in a supply transformer may also function as a choke, in which case a separate choke is not needed.

The operating life of fluorescent lamps depends on the amount of active material on the cathode surface, and when the active material is used up, the fluorescent lamp stops functioning. The ionization on the cathode surface of the fluorescent lamp forms a hot spot at the particular point of the cathode where the ionization occurs and the current is transferred to the gas. The hot spot moves along the cathode as the lamp is used, and on a new lamp is close to the cathode terminal, which is connected to a higher potential. As the active material in the cathodes wears, the hot spot moves along the cathode surface.

A problem with fluorescent lamps is to determine the time for changing the lamps. It is most economical to time the change in such a manner that as little as possible of the operating life of the fluorescent lamps is left unused. Very often fluorescent lamp lighting fixtures are difficult to put in place, which is why all fluorescent lamps located in one place should preferably be changed at the same time. A typical example of such a place is a factory hall, where the floor to ceiling height and the location of the lamps above the machines or equipment impede the change.

In vehicles, an anticipating signal indicating that fluorescent lamps are burnt out makes it easier to plan the service for a vehicle. The aim is to time the vehicle service so that as many as possible of the fluorescent lamps which have almost burnt out can be changed during the service. Selecting the same time for the vehicle service and for the lamp change may reduce the number of vehicle lay days. Examples of such vehicles to be serviced are buses, railway carriages or passenger ships.

It is previously known to anticipate the end of the operating life of a fluorescent lamp by measuring the lamp voltage between the cathodes in the lamp. Patent application EP 0 731 437 A2 presents an arrangement that enables to detect a change in the lamp voltage, before the lamp stops functioning. In accordance with the publication, after detecting the change in the voltage the current supply is cut off, and the lamp slowly dims. A drawback with the equipment according to the reference publication is that the voltage to be measured over the lamp is quite high, in which case the measurement equipment should also be constructed in accordance with corresponding voltage levels. The lamp voltage is highly dependent on filling gas properties, operating temperature and current change when the power supply voltage varies. Due to the facts mentioned above, determining the remaining operating life of the lamp on the basis of measuring the lighting voltage between the cathodes is very unreliable.

It is also previously known to determine the amount of active material in the cathode, on the basis of which the remaining operating life of the fluorescent lamp is concluded. Patent application FI 980 322 describes a method and an arrangement for determining the amount of active material remaining in the cathode by measuring the voltage over the cathodes of the fluorescent lamp. A drawback with the equipment according to reference publication 980 322 is that the variation in tolerance of cathodes in different lamp units affect the measuring accuracy.

BRIEF DESCRIPTION OF THE INVENTION

It is an object of the present invention to provide a method and an arrangement for eliminating or for at least alleviating the above drawbacks and for allowing to determine the possibly remaining operating life of a fluorescent lamp more reliably and using a simpler equipment. This object is achieved with the method of the invention, characterized by determining the remaining operating life of the fluorescent lamp from a phase difference of a voltage applied over at least one cathode in relation to another current or voltage phase in the fluorescent lamp circuit.

The method of the invention is based on the idea that the amount of active material in the cathodes of the fluorescent lamp determining the remaining operating life of the lamp correlates with the phase of the voltage applied over the cathodes.

The invention further relates to an arrangement, characterized by comprising a phase detector for measuring a phase difference of a voltage applied over the cathodes in relation to another current or voltage phase in the fluorescent lamp circuit.

An advantage with the method of the invention is that the absolute values of the currents and voltages need not be known, but the amount of remaining active material in the cathodes can be determined by means of the phase difference, whereby the variations in tolerance of the resistance of the cathodes in different lamp units do not affect the measuring accuracy. The method of the invention also operates reliably and is easy to implement.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

Figure 1:
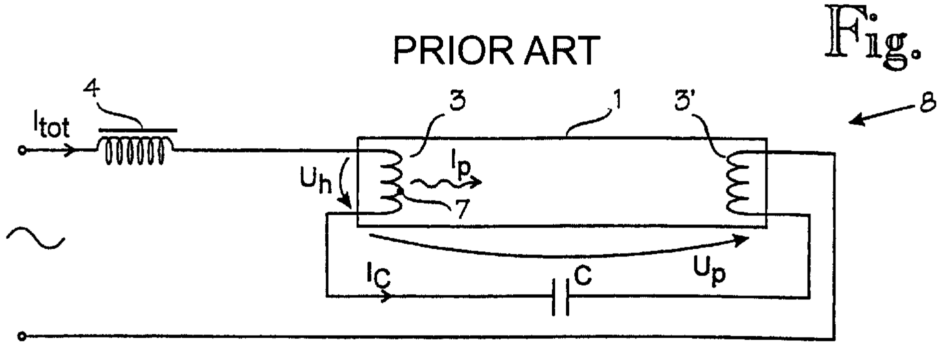
FIG. 1 shows a ballast starter circuit of a fluorescent lamp.

FIG. 1 shows a ballast starter circuit which is common when a fluorescent lamp 1 is used at a high frequency, and in which a choke 4 is connected between the fluorescent lamp 1 and a supply network, and a capacitor C is in series with cathodes 3 and 3'.

In a fluorescent lamp circuit 8 according to FIG. 1, the current flows through the lamp by means of a gaseous filler in the lamp, when the fluorescent lamp is operating. The current is transferred from the cathode 3 to the lamp 1 from a point, where the cathode surface comprises an active material of the cathode which is needed for the fluorescent lamp to operate and which is at a highest possible potential in relation to the opposite cathode. A hot spot 7 is formed on said cathode location, from where the current is transferred from the cathode to the gas in the lamp. When the hot spot is located at the end of the current source of the cathode 3, i.e. active material remains along the entire length of the cathode 3, only a capacitive current $1_c$ of the capacitor C travels through the resistance of the cathode 3, whereby the phase difference between a filament voltage $U_h$ applied over the cathode 3 and a discharging current $I_p$ is 90°. As the lamp ages in use and the active material in the cathode wears, the hot spot of the cathode moves along the cathode in such a manner that the current of an arc discharge, which is resistive by nature, starts to move through the cathode, in which case the phase difference between the filament voltage $U_h$ and the discharging current $I_p$ decreases as the active material is reduced. The size of the phase difference therefore allows to reliably deduce the remaining operating life of the cathode 3 and the fluorescent lamp 1.

Figure 2:
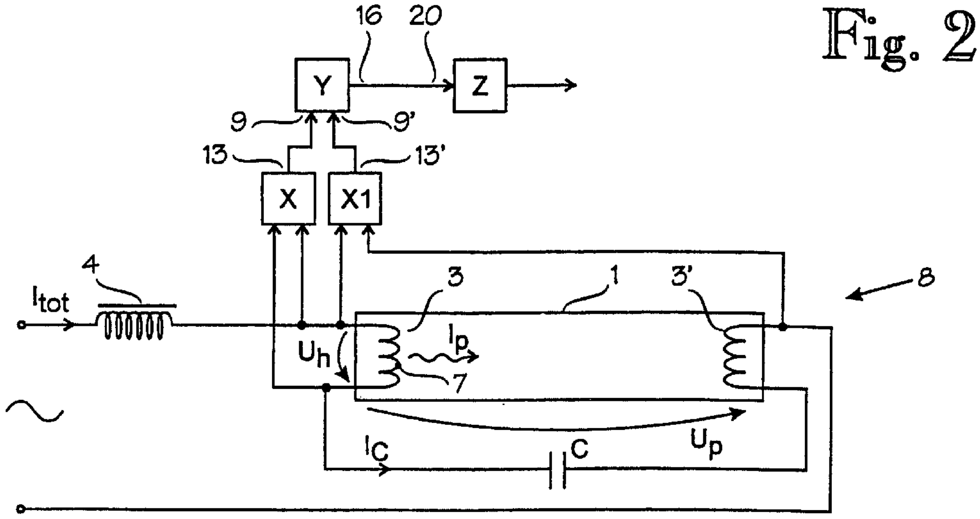
FIGS. 2, 3 and 4 show arrangements according to preferred embodiments for determining the remaining operating life of the fluorescent lamp, FIG. 5 schematically shows how an element X shown in FIGS. 2, 3 and 4 is implemented.

The phase of the filament voltage $U_h$ is compared with the phase of a discharging voltage $U_p$ in the embodiment shown in FIG. 2. An element X is connected between the cathode 3 terminals that converts the filament voltage $U_h$ into a square wave with a constant amplitude. Correspondingly an element X1 is connected between the cathodes 3 and 3' of the fluorescent lamp 1 that converts the voltage $U_p$ into a square wave with a constant amplitude. Outputs 13 and 13' of the elements X and X1 are connected to a phase detector Y, from an output port 16 of which a signal that is comparable with the phase difference of the signals in input ports 9 and 9', for example a direct-current voltage, is obtained. In this example the output port 16 of the phase detector Y is further connected to an input port 20 of an element Z, which produces an alarm signal, if the signal comparable with the phase difference exceeds a predetermined preferable threshold value. The threshold value in question can be selected to be suitable for any application. The alarm signal can be automatically used to perform some predetermined measures, such as connecting components to an electrical circuit. The alarm signal or the output signal of the phase detector Y can also be produced as a visual signal by using, for example, a pilot light indicating the alarm. The alarm signal can also, if needed, be connected to data processing systems, in which case a report may indicate the approaching end of the operating life of the fluorescent lamp.

Figure 3:
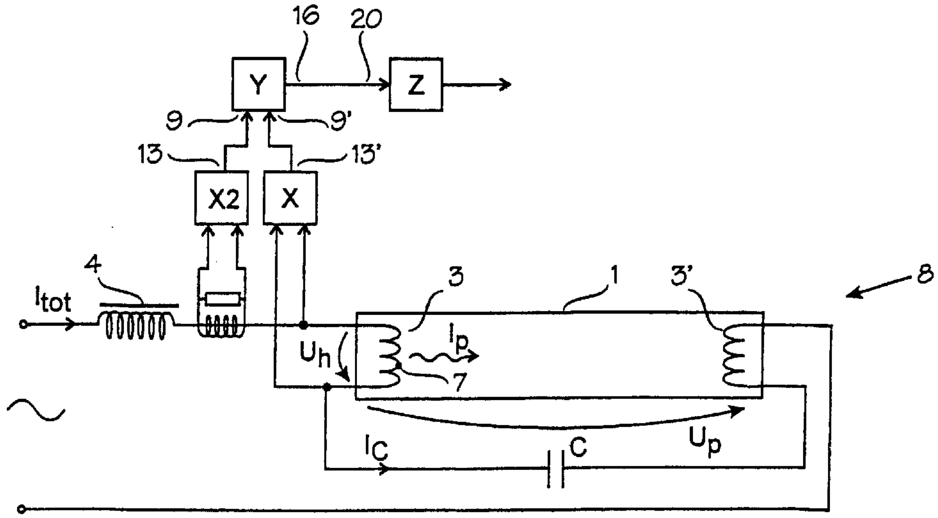

In the embodiment according to FIG. 3, the phase of the filament voltage $U_h$ is compared with the phase of a total current $I_{tot}$ of the fluorescent lamp circuit 8. An element X2 converts the total current $I_{tot}$ into a square wave with a constant amplitude.

Figure 4:
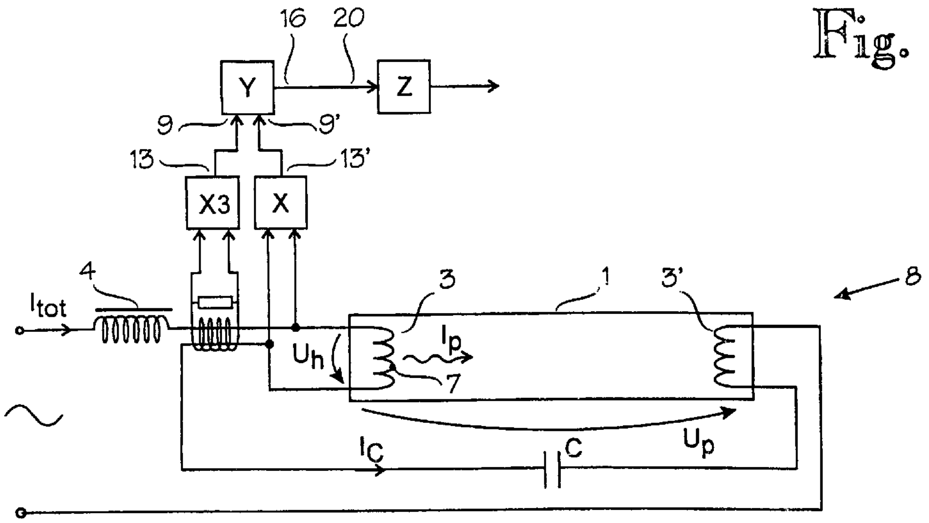

In the embodiment according to FIG. 4, the phase of the filament voltage $U_h$ is compared with the phase of a discharging current $I_p$. An element X3 converts the discharging current $I_p$ into a square wave with a constant amplitude.

Figure 5:
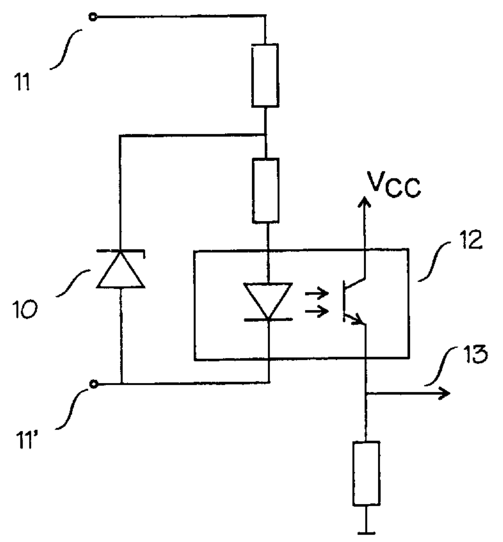

FIG. 5 shows a schematic implementation for the element X, which converts the signal connected to an output port 11, 11' into a square wave with a constant amplitude. The peak of said signal is cut using a Zener diode 10 and the signal obtained is transferred to the output port 13 through an opto-isolator 12.

Figure 6:
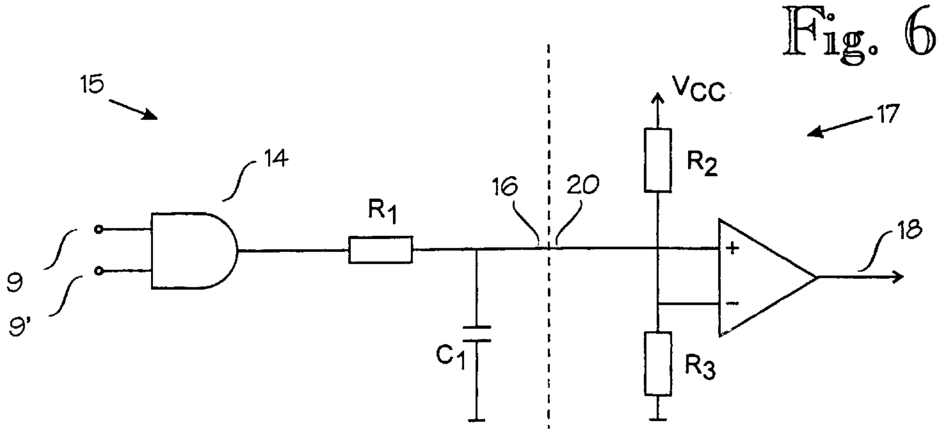
FIG. 6 schematically shows how a phase detector Y and an element Z shown in FIGS. 2, 3 and 4 are implemented.

In FIG. 6 a connection 15 shows a schematic implementation of the phase detector Y and a connection 17 further shows a schematic implementation for the element Z. The phase difference of input signals in the phase detector Y is indicated with an AND port 14, the output signal of which is filtered to a direct-current voltage using an RC circuit formed of a resistor R1 and a capacitor C1. An alarm signal is obtained from an output port 18 of the element Z if the voltage in the input 20 (i.e. in the output port 16 of the phase detector Y) exceeds an advantageous threshold value set by resistors R2 and R3.

It is obvious for those skilled in the art that the basic idea of the invention can be implemented in various ways. The invention and its embodiments are thus not restricted to the examples above but can be modified within the scope of the attached claims.

I claim:

1. A method for determining remaining operating life of a fluorescent lamp, wherein the fluorescent lamp includes at least a first cathode having a first voltage and wherein the fluorescent lamp is part of a lamp circuit, the lamp circuit comprising a capacitor, an inductor and at least a second voltage or current, comprising:

detecting a phase of the first voltage;

detecting a phase of the second voltage or current of the lamp circuit; and determining the remaining operating life of the fluorescent lamp by measuring a phase difference between the phase of the first voltage and the phase of the second voltage or current.

2. A method as claimed in claim 1, wherein the second voltage or current is a discharging voltage of the fluorescent lamp.

3. A method as claimed in claim 2, wherein the size of the phase difference is compared to a predetermined threshold value and an alarm signal is produced, if the measured phase difference is lower than the predetermined threshold value.

4. A method as claimed in claim 1, wherein the second voltage or current is a discharging current of the fluorescent lamp.

5. A method as claimed in claim 4, wherein the size of the phase difference is compared to a predetermined threshold value and an alarm signal is produced, if the measured phase difference is lower than the predetermined threshold value.

6. A method as claimed in claim 1, wherein the second voltage or current is a total current of the fluorescent lamp circuit.

7. A method as claimed in claim 6, wherein the size of the phase difference is compared to a predetermined threshold value and an alarm signal is produced, if the measured phase difference is lower than the predetermined threshold value.

8. A method as claimed in claim 1, wherein the phase difference is compared to a predetermined threshold value and an alarm signal is produced if the phase difference is lower than the predetermined threshold value.

9. An arrangement for determining the remaining operating life of a fluorescent lamp comprising first and second cathodes, the first cathode having a first voltage, the fluorescent lamp being a part of a fluorescent lamp circuit, the fluorescent lamp circuit comprising the fluorescent lamp and a ballast comprising a capacitor and an inductance, the fluorescent lamp circuit having at least a second voltage or current, wherein the arrangement comprises:

a first element connected to the first cathode, wherein the first element converts the first voltage to a first square wave having constant amplitude;

a second element connected to the lamp circuit, wherein the second element converts the second voltage or current of the lamp circuit to a second square wave having constant amplitude;

a phase detector connected to the first element and the second element, the phase detector measuring a phase difference between the first voltage and the second current or voltage and in response providing an output indicating remaining operating lamp life.

10. An arrangement as claimed in claim 9, wherein the arrangement further comprises means functionally connected to the phase detector for producing an alarm signal in response to the fact that the phase difference of the first voltage and the second voltage or current is lower than a predetermined threshold value.

11. An arrangement for determining remaining operating life of a fluorescent lamp, wherein the fluorescent lamp includes at least a first cathode having a first voltage and wherein the fluorescent lamp is part of a lamp circuit, the lamp circuit comprising a capacitor, an inductor and at least a second voltage or current, the arrangement comprising:

means for detecting a phase of the first voltage;

means for detecting a phase of the second voltage or current; and means for determining the remaining operating life of the fluorescent lamp by measuring a phase difference between the phase of the first voltage and the phase of the second voltage or current.

12. An arrangement as claimed in claim 11, further comprising:

means for producing an alarm signal in response to the phase difference being lower than a predetermined threshold value.

13. An arrangement as claimed in claim 11, wherein the means for detecting the phase of the first voltage and the phase of second voltage or current comprises a zener diode and an opto-isolator for converting the phase of the first voltage and the second voltage or current into a square wave with constant amplitude.

14. A method for determining remaining operating life of a fluorescent lamp comprising first and second cathodes, the first cathode having a first voltage, the fluorescent lamp being part of a fluorescent lamp circuit, the fluorescent lamp circuit including the fluorescent lamp and a ballast comprising a capacitor and an inductance, the method comprising the steps of:

converting the first voltage of the first cathode to a first square wave having constant amplitude;

converting a second voltage or current of the lamp circuit to a second square wave having constant amplitude;

measuring the phase difference between the first voltage and the second voltage or current; and determining the remaining operating life of the lamp based upon the phase difference.

15. A method as claimed in claim 14, wherein the second voltage or current is a discharging voltage of the fluorescent lamp.

16. A method as claimed in claim 14, wherein the second voltage or current is a discharging current of the fluorescent lamp.

17. A method as claimed in claim 14, wherein the second voltage or current is a total current of the fluorescent lamp circuit.

18. A method as claimed in claim 14, wherein the phase difference is compared to a predetermined threshold value and an alarm signal is produced if the phase difference is lower than the predetermined threshold value.

* * * * *